(12) United States Patent
Wang et al.

(10) Patent No.: US 10,205,061 B2
(45) Date of Patent: Feb. 12, 2019

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Huining Wang, Xiamen (CN); Sheng-hsien Hsu, Xiamen (CN); Kang-wei Peng, Xiamen (CN); Su-hui Lin, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/817,216

(22) Filed: Nov. 19, 2017

(65) Prior Publication Data

US 2018/0102461 A1 Apr. 12, 2018

Related U.S. Application Data

(63) Continuation of application No. PCT/CN2016/111660, filed on Dec. 23, 2016.

(30) Foreign Application Priority Data

Jan. 6, 2016 (CN) .......................... 2016 1 0002739

(51) Int. Cl.
*H01L 33/42* (2010.01)
*H01L 33/14* (2010.01)
(Continued)

(52) U.S. Cl.
CPC .......... *H01L 33/42* (2013.01); *H01L 25/0753* (2013.01); *H01L 33/007* (2013.01);
(Continued)

(58) Field of Classification Search
CPC ..... H01L 33/42; H01L 33/06; H01L 25/0753; H01L 33/32; H01L 33/0095; H01L 33/007

See application file for complete search history.

(56) References Cited

U.S. PATENT DOCUMENTS

| 6,420,736 B1 * | 7/2002 | Chen ........................ H01L 33/42 |
| | | 257/103 |
| 7,417,264 B2 * | 8/2008 | Song ........................ H01L 33/42 |
| | | 257/102 |

(Continued)

FOREIGN PATENT DOCUMENTS

| CN | 102760812 A | 10/2012 |
| CN | 102891256 A | 1/2013 |

(Continued)

OTHER PUBLICATIONS

Moon, et. al., Enhancement of hole injection using ozone treated Ag nanodots dispersed on indium tin oxide anode for organic light emitting diodes, Applied Physics Letters, 90, 163516 (2007).

*Primary Examiner* — William Coleman
(74) *Attorney, Agent, or Firm* — Syncoda LLC; Feng Ma; Junjie Feng

(57) ABSTRACT

A light-emitting diode includes from bottom to up: a substrate; a light-emitting epitaxial layer laminated by semiconductor material layers over the substrate; a current spreading layer doped with conductive metal nanomaterial groups over the light-emitting epitaxial layer; and metal nanomaterial groups with high visible light transmittance over the current spreading layer. The conductive metal nanomaterial groups dispersed inside the ITO current (Continued)

spreading layer can reduce horizontal resistance of the current spreading layer and improve horizontal spreading uniformity of current; and metal nanomaterial groups with high visible light transmittance are distributed over the upper surface of the current expansion layer for roughening and increasing light extract efficiency.

5 Claims, 3 Drawing Sheets

(51) Int. Cl.
    *H01L 33/22* (2010.01)
    *H01L 25/075* (2006.01)
    *H01L 33/00* (2010.01)
    *H01L 33/06* (2010.01)
    *H01L 33/32* (2010.01)

(52) U.S. Cl.
    CPC .......... *H01L 33/0095* (2013.01); *H01L 33/06* (2013.01); *H01L 33/14* (2013.01); *H01L 33/22* (2013.01); *H01L 33/32* (2013.01); *H01L 2933/0016* (2013.01)

(56) References Cited

U.S. PATENT DOCUMENTS

| | | | | |
|---|---|---|---|---|
| 8,203,170 | B2* | 6/2012 | Shim | H01L 33/42 |
| | | | | 257/103 |
| 8,513,688 | B2* | 8/2013 | Pan | H01L 33/46 |
| | | | | 257/98 |
| 8,525,215 | B2* | 9/2013 | Choi | H01L 33/22 |
| | | | | 257/99 |
| 9,337,384 | B2* | 5/2016 | Yin | H01L 33/40 |
| 9,337,406 | B2* | 5/2016 | Yin | H01L 33/38 |
| 2012/0273796 | A1* | 11/2012 | Zhao | H01L 33/16 |
| | | | | 257/76 |
| 2012/0326117 | A1* | 12/2012 | Tanaka | H01L 33/38 |
| | | | | 257/13 |
| 2017/0288092 | A1* | 10/2017 | Huang | H01L 33/02 |

FOREIGN PATENT DOCUMENTS

| | | |
|---|---|---|
| CN | 202712251 U | 1/2013 |
| CN | 104078616 A | 10/2014 |
| CN | 104659167 A | 5/2015 |
| CN | 104769733 A | 7/2015 |
| KR | 101483230 B1 | 1/2015 |

* cited by examiner

LIGHT EMITTING DIODE AND FABRICATION METHOD THEREOF

CROSS-REFERENCE TO RELATED APPLICATIONS

The present application is a continuation of, and claims priority to, PCT/CN2016/111660 filed on Dec. 23, 2016, which claims priority to Chinese Patent Application No. 201610002739.5 filed on Jan. 6, 2016. The disclosures of these applications are hereby incorporated by reference in their entirety.

BACKGROUND

With years of development of light-emitting diode (LED), the III-V group compound is the mainstream semiconductor material for fabricating a light-emitting diode, in particular, the GaN-based and AlGaInP-based materials. Conventional P-type III-V group semiconductor material has poor current spreading performance. To enable uniform injection of current into the light-emitting layer, a current spreading layer is added over the P-type material layer. Among materials of the current spreading layer (TCL), the indium tin oxide (ITO), cadmium tin oxide (CTO), indium oxide (InO) and zinc oxide (ZnO) can improve the current spreading effect. Among them, ITO is most widely applied, which is a semiconductor functional material with excellent photoelectric property featuring high visible light transmittance (>80%), low resistivity ($10^{-3}$-$10^{-4}$ $\Omega \cdot cm$), large band gap (3.6-3.9 eV) and high refractive index (1.8-2.0).

SUMMARY

The inventors of the present application have recognized that, for a normal light-emitting diode (LED), as shown in FIG. 1, due to refractive index difference of ITO (1.8-2.0) and the epoxy resin (1.5-1.55) for packaging, and ITO absorption and surface reflectivity, the extraction efficiency for light from the multiple quantum wells (MQWs) is still insufficient. In addition, most current passing through the ITO film is concentrated near the electrode (the arrow in the figure indicates the current transfer channel), resulting in small effective light-emitting area of MQWs, and there is still large room for improvement for horizontal current spreading.

To solve the above problems of light-emitting diodes, the embodiments in the present disclosure provide a light-emitting diode with a transparent electrode based on doping current spreading layer and fabrication method thereof.

According to a first aspect of the present disclosure, a light-emitting diode is provided, which includes from bottom to up: a substrate; a light-emitting epitaxial layer laminated by semiconductor material layers over the substrate; a current spreading layer doped with conductive metal nanomaterial groups over the light-emitting epitaxial layer; and metal nanomaterial groups with high visible light transmittance over the current spreading layer.

In some embodiments, the conductive metal nanomaterial groups are Ag oxides, Zn oxides, Sn oxides, Ti oxides or any of their combinations; the metal nanomaterial groups with high visible light transmittance are Al oxides, Mg oxides, Ga oxides or any of their combinations.

In some embodiments, the current spreading layer is ITO, ZnO, CTO, InO, In-doped ZnO, Al-doped ZnO or Ga-doped ZnO or any of their combinations.

In some embodiments, the high visible light transmittance is preferred to be >70%, and most preferably >80%.

According to a second aspect of the present disclosure, a light-emitting diode is provided, which includes from bottom to up: a substrate; a light-emitting epitaxial layer laminated by semiconductor material layers over the substrate; an ITO current spreading layer doped with conductive Ag nanomaterial groups over the light-emitting epitaxial layer; and Al nanomaterial groups over the ITO current spreading layer.

In some embodiments, the Ag nanomaterial groups comprise $Ag_2O$ or $AgInO_2$ or their combinations, which are dispersed inside the ITO current spreading layer to reduce horizontal resistance of the current spreading layer and to improve horizontal spreading uniformity of current.

In some embodiments, the Al nanomaterial groups include spaced $Al_2O_3$ particles, which are distributed on the upper surface of the ITO current spreading layer for roughening and increasing light extraction efficiency.

In some embodiments, the Al nanomaterial groups are distributed discontinuously.

In some embodiments, the light-emitting diode also includes an electrode for electric conduction with the light-emitting epitaxial layer and/or the current spreading layer.

According to a third aspect of the present disclosure, a fabrication method of a light-emitting diode is provided, which includes: (1) providing a substrate and growing a light-emitting epitaxial layer laminated by semiconductor material layers with epitaxial growth; (2) forming a current spreading layer doped with conductive metal over the light-emitting epitaxial layer; (3) forming metal layer(s) on the current spreading layer; and (4) taking a one-time annealing thermal treatment.

In some embodiments, the conductive metal is Ag, Zn, Sn, Ti or any of their combinations; and the metal layer is Al, Mg, Ca or any of their combinations.

In some embodiments, the current spreading layer is ITO, ZnO, CTO, InO, In-doped ZnO, Al-doped ZnO or Ga-doped ZnO or any of their combinations.

In some embodiments, the high visible light transmittance is preferred to be >70%, and most preferably >80%.

According to a fourth aspect of the present disclosure, a fabrication method of a light-emitting diode is provided, which includes: (1) providing a substrate and growing a light-emitting epitaxial layer laminated by semiconductor material layers with epitaxial growth; (2) forming an ITO current spreading layer doped with conductive Ag metal over the light-emitting epitaxial layer; (3) forming an Al metal layer on the ITO current spreading layer; and (4) taking a one-time annealing thermal treatment.

In some embodiments, the ITO current spreading layer doped with conductive Ag metal is formed by simultaneous magnetron sputtering and the Al metal layer is formed by electron beam evaporation.

In some embodiments, after the annealing thermal treatment, the Ag metal is oxidized into conductive Ag nanomaterial groups, which are dispersed inside the ITO current spreading layer.

In some embodiments, after the annealing thermal treatment, the Al metal layer is oxidized into Al nanomaterial groups with discontinuous distribution.

In some embodiments, the one-time annealing thermal treatment conditions are shown below: take quick aerobic annealing for 200-300 s under 550-600° C., and keep 15-30 sccm oxygen intake to fully oxide the doped Al and Ag metals simultaneously.

In some embodiments, form an electrode for electric conduction with the light-emitting epitaxial layer and/or the current spreading layer.

According to a fifth aspect of the present disclosure, a light-emitting system comprising a plurality of light-emitting diodes is provided. Each light-emitting diode further comprises from bottom to up: a substrate; a light-emitting epitaxial layer laminated by semiconductor material layers over the substrate; a current spreading layer doped with conductive metal nanomaterial groups over the light-emitting epitaxial layer; and metal nanomaterial groups with high visible light transmittance over the current spreading layer.

According to a sixth aspect of the present disclosure, a light-emitting system comprising a plurality of light-emitting diodes is provided. Each light-emitting diode further comprises from bottom to up: a substrate; a light-emitting epitaxial layer laminated by semiconductor material layers over the substrate; an ITO current spreading layer doped with conductive Ag nanomaterial groups over the light-emitting epitaxial layer; and Al nanomaterial groups with high visible light transmittance over the ITO current spreading layer. The light-emitting system can be used, for example, in lighting, signage, displays, etc.

Compared with existing technologies, the various embodiments in the present disclosure can have one or more of the following technical effects:

(1) Improved current spreading of LED device. After annealing under high temperature oxygen atmosphere, the conductive metals form conductive oxide groups inside the current spreading layer, which reduce horizontal resistance of the current spreading layer. This enhances current horizontal expansion, enlarges effective light-emitting region of the light-emitting layer, therefore increases light-emitting efficiency.

(2) Improved light extraction efficiency of LED device. After annealing under high temperature oxygen atmosphere, the current spreading layer surface forms metal nanomaterial groups with high visible light transmittance, wherein the refractivity is between that of the current spreading layer and the epoxy resin (1.5-1.55), which is good for light extraction and for roughening of the current spreading layer surface to increase light extraction efficiency; meanwhile, as the nanomaterial groups with high visible light transmittance would not form a continuous film, it would not affect the contact between the electrode and the current spreading layer.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings may not be drawn to scale.

In the drawings.

100: substrate; 101: first confinement layer; 102: light-emitting layer; 103: second confinement layer; 104: ITO current spreading layer; 105: Ag nanomaterial groups; 106: Al nanomaterial groups; 107: P electrode; 108: N electrode.

DETAILED DESCRIPTION

References will be made to the drawings to give clear description of the present disclosure, including the preferred embodiments. It is to be understood that by those skilled in the art that various changes may be made therein without influencing the beneficial effects of the present disclosure. Therefore, the descriptions below shall be understood as widely known by those skilled in the art and are not meant to limit the scope of the disclosure.

The exemplary embodiments for the LED structure and fabrication method thereof are merely for purposes of illustration. It should be appreciated, therefore, that various improvements made by a person of ordinary skill in the art, in addition to those described above, are deemed to be within the spirit scope of this disclosure.

Figure 1:
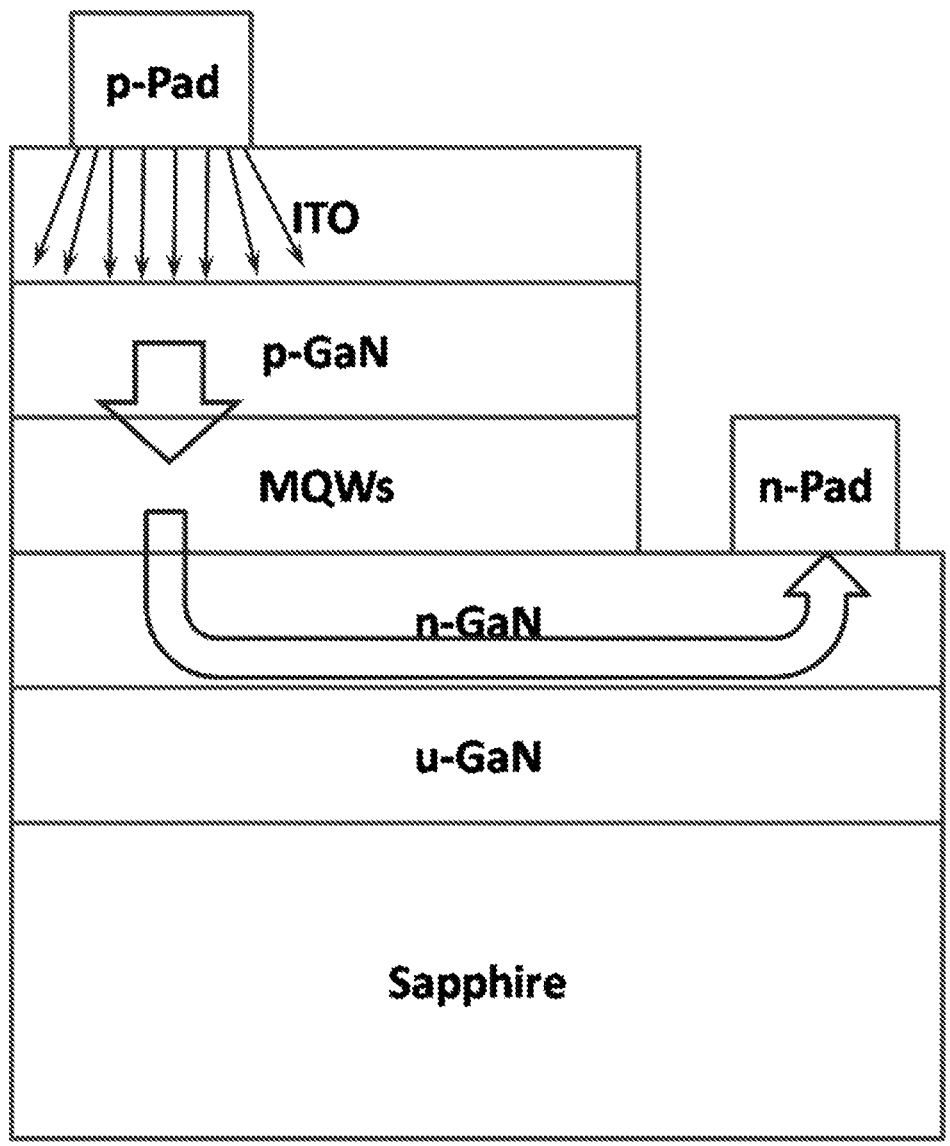
FIG. 1 shows a structural diagram of a conventional normal light-emitting diode.
Figure 2:
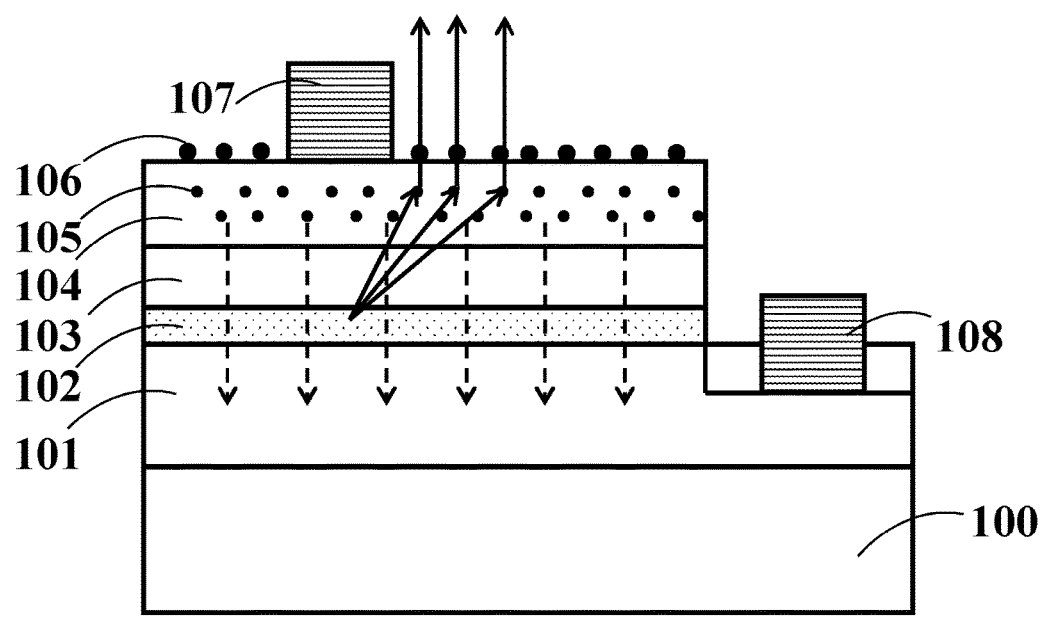
FIG. 2 shows a structural diagram of a light-emitting diode chip with a transparent electrode according to some embodiments disclosed in the present application.

With reference to FIG. 2, a sectional view of a LED structure according to some embodiments of the present disclosure is provided. The LED structure includes: a substrate 100; a light-emitting epitaxial layer (a first confinement layer 101, a light-emitting layer 102 and a second confinement layer 103); an ITO current spreading layer 104 doped with conductive Ag nanomaterial groups 105; Al nanomaterial groups 106 and a metal electrode layer (P electrode 107 and N electrode 108).

In some embodiments of the present disclosure, the substrate 100 can be selected from a group of materials including: sapphire substrate, SiC substrate, Si substrate, GaN substrate or ZnO substrate. In preferred embodiments, the substrate 100 is a sapphire substrate.

In some embodiments, the epitaxial layer, which is deposited over the substrate 100, can be GaN-based, GaP-based, GaNP-based or ZnO-based material. In a preferred embodiment, the epitaxial layer is made of GaN-based material and includes a first confinement layer 101, a light-emitting layer 102 and a second confinement layer 103 laminated from bottom to up, wherein, the first confinement layer 101 is an N-type GaN layer structure; the light-emitting layer 102 is an AlGaN multi-quantum well active layer; and the second confinement layer 103 is a P-type AlGaN layer. In some embodiments, the epitaxial layer structure is not limited to buffer layer, N-type GaN layer structure, AlGaN multi-quantum well active layer and P-type AlGaN layer. Other epitaxial layer structures capable for light-emitting, e.g., N-type GaN layer, (InGaN)/GaN multi-quantum well active layer and P-type GaN layer, are also included in the present disclosure.

The ITO current spreading layer 104 doped with conductive Ag nanomaterial groups 105 are formed on the second confinement layer 103, with an ITO thickness of 500-5000 Å. In some embodiments, preferably, the Ag nanomaterial groups 105 comprise $Ag_2O$ and $AgInO_2$, with a grain size of 1-30 nm, which are dispersed inside the ITO current spreading layer to reduce horizontal resistance of the current spreading layer and to improve horizontal spreading uniformity of current.

The Al nanomaterial groups 106 are formed on the ITO current spreading layer 104. In some embodiments, preferably, the Al nanomaterial groups 106 are spaced $Al_2O_3$ grains with grain size of 1-10 nm, in which, the refractive index (about 1.76) is between that of ITO (1.8-2.0) and the epoxy resin (1.5-1.55) for packaging, which is good for light extraction and for roughening of the upper surface of the ITO current spreading layer to increase light extraction efficiency.

The P electrode 107 and the N electrode 108 are over the surfaces of the ITO current spreading layer 104 and the exposed first confinement layer 101 respectively, as electrodes for electric conduction that inject current for the light-emitting epitaxial layer. In some embodiments of the present disclosure, the LED is of a vertical structure and the N electrode can be directly arranged at the substrate back giving that the substrate is conducting, e.g., Si wafer.

Figure 3:
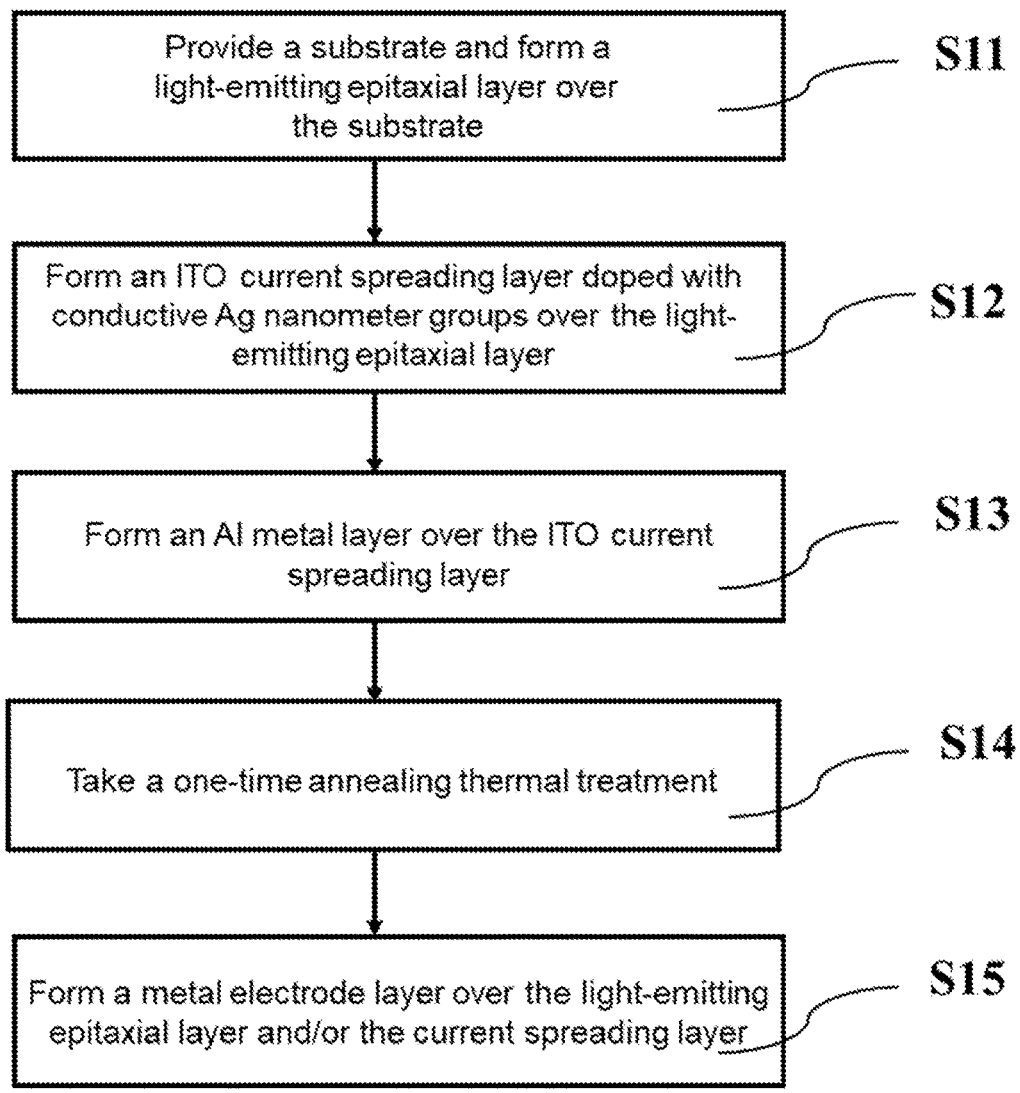
FIG. 3 shows a flow diagram of a light-emitting diode chip with a transparent electrode according to some embodiments disclosed in the present application.

Descriptions of the LED fabrication method will be given below. Refer to FIG. 3, a flow diagram of LED fabrication method according to some embodiments of the present disclosure is provided.

First, in Step S11, provide a substrate 100 and form a light-emitting epitaxial layer over the substrate 100 via metal-organic chemical vapor deposition (MOCVD). The epitaxial layer includes a first confinement layer 101, a light-emitting layer 102 and a second confinement layer 103 laminated from bottom to up.

Then, in Step S12, form an ITO current spreading layer 104 doped with conductive Ag nanomaterial groups 105 over the light-emitting epitaxial layer with an ITO thickness of 500-5000 Å, wherein, the film coating method prefers to be simultaneous magnetron sputtering, and the deposition rate is 0.1-1 Å/s. As Ag metal nanometer particles are doped inside the ITO, the Ag and ITO can be sputtered simultaneously with magnetron sputtering for better doping effect, which simplifies process flows and improves operating efficiency since no additional process steps and time are required.

Next, in Step S13, form an Al metal layer 105 with a thickness of 1-10 nm over the ITO current spreading layer 104. The evaporated Al layer is too thin to form films with continuous distribution, therefore would not affect the subsequent contact between the metal electrode and the ITO; the film coating method prefers to be electron beam evaporation, and the deposition rate is 0.1-1 Å/s. Since Al is of small atomic mass, nanomaterial groups can be well formed over the ITO current spreading layer via electron beam evaporation.

Then, in step S14, take a one-time annealing thermal treatment with the following process conditions: take quick aerobic annealing for 200-300 s under 550-600° C., and keep 15-30 sccm oxygen intake to fully oxide the doped Ag and Al metals simultaneously. After the annealing thermal treatment, the Ag metal is oxidized into conductive Ag nanomaterial groups (such as $Ag_2O$ and $AgInO_2$). On the one hand, conductive $Ag_2O$ and $AgInO_2$ are formed by combining oxygen inside the Ag and ITO; on the other hand, with a combination of Ag and oxygen, oxygen components inside the ITO current spreading layer are reduced to generate more oxygen vacancy and electrons. This increases charge carrier concentration, and reduces ITO bulk resistance, thus improving uniformity of current horizontal spreading (as the dotted arrow in FIG. 2 shown). In this way, the effective light-emitting region of the light-emitting layer is enlarged to improve light-emitting efficiency; the Al metal layer is oxidized into Al nanomaterial groups (such as $Al_2O_3$ grains) with discontinuous distribution, in which, the refractive index is high (about 1.76) and between that of ITO (1.8-2.0) and the epoxy resin (1.5-1.55) for packaging, which is good for light extraction and for roughening of the ITO current spreading layer surface to increase light extraction efficiency as the refractivity difference would change light critical angle (as the dotted arrow in FIG. 2 shown).

Last, in step S15, form a metal electrode layer over the light-emitting epitaxial layer and/or the current spreading layer. In this embodiment, it is preferred to form a P electrode 107 and an N electrode 108 with gold (Au) over surfaces of the ITO current spreading layer 104 and the exposed first confinement layer 101, respectively.

It should be noted that, in the aforesaid embodiments, the metal electrode is fabricated after the one-time annealing thermal treatment. The metal electrode can be also fabricated before the one-time annealing thermal treatment. The conductive metal nanomaterial groups, in addition to the Ag nanomaterial groups mentioned in the aforesaid embodiment, can also be Zn oxides, Sn oxides, Ti oxides or any of their combinations; and the metal nanomaterial groups with high visible light transmittance, in addition to the Al nanomaterial groups mentioned in the aforesaid embodiment, can also be Mg oxides, Ga oxides or any of their combinations. The current spreading layer, in addition to the ITO mentioned in the aforesaid embodiment, can also be ZnO, CTO, InO, In-doped ZnO, Al-doped ZnO or Ga-doped ZnO or any of their combinations.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a light-emitting diode, the method comprising:
   (1) providing a substrate; growing a light-emitting epitaxial layer including semiconductor material layers via epitaxial growth;
   (2) forming a current spreading layer doped with conductive metals over the light-emitting epitaxial layer;
   (3) forming metal layers over the current spreading layer;
   (4) performing a one-time annealing thermal treatment; wherein:
   the current spreading layer comprises an ITO current spreading layer;
   the conductive metals comprise conductive Ag metals;
   the metal layers comprise an Al metal layer; and
   the ITO current spreading layer doped with conductive Ag metal is formed by simultaneous magnetron sputtering, and the Al metal layer is formed by electron beam evaporation.

2. The fabrication method of claim 1, wherein, after the annealing thermal treatment, the Ag metal is oxidized into conductive Ag nanomaterial groups dispersed inside the ITO current spreading layer.

3. The fabrication method of claim 1, wherein, after the annealing thermal treatment, the Al metal layer is oxidized into Al nanomaterial groups with discontinuous distribution.

4. The fabrication method of claim 1, wherein the one-time annealing thermal treatment is under high temperature with continuous oxygen input during the annealing thermal treatment to fully oxide the doped Al and Ag metals simultaneously.

5. The fabrication method of claim 1, wherein, the one-time annealing thermal treatment comprises fast aerobic annealing for 200-300 s under 550-600° C., and a 15-30 sccm oxygen intake.

* * * * *